(12) United States Patent
Yamamoto et al.

(10) Patent No.: US 8,400,612 B2
(45) Date of Patent: Mar. 19, 2013

(54) WAVEFRONT ABERRATION MEASUREMENT APPARATUS, EXPOSURE APPARATUS, AND METHOD OF MANUFACTURING DEVICE

(75) Inventors: Kazuki Yamamoto, Shimotsuke (JP); Yoshinori Ohsaki, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 291 days.

(21) Appl. No.: 12/793,873

(22) Filed: Jun. 4, 2010

(65) Prior Publication Data

US 2010/0309448 A1    Dec. 9, 2010

(30) Foreign Application Priority Data

Jun. 8, 2009  (JP) ................................. 2009-137723

(51) Int. Cl.
*G03B 27/68* (2006.01)

(52) U.S. Cl. ............... 355/52; 355/68; 355/77; 356/515

(58) Field of Classification Search .................. 356/515; 355/52, 68, 77
See application file for complete search history.

(56) References Cited

U.S. PATENT DOCUMENTS

| | | | |
|---|---|---|---|
| 6,000,799 A * | 12/1999 | Van de Velde | 351/205 |
| 6,312,373 B1 * | 11/2001 | Ichihara | 356/515 |
| 7,619,748 B2 | 11/2009 | Nakauchi | |
| 8,267,515 B2 * | 9/2012 | Azar et al. | 351/205 |
| 2004/0174533 A1 * | 9/2004 | Nakauchi | 356/515 |
| 2009/0185153 A1 * | 7/2009 | Epple | 355/67 |
| 2009/0225328 A1 * | 9/2009 | Yamamoto | 356/515 |
| 2010/0309448 A1 * | 12/2010 | Yamamoto et al. | 355/53 |

FOREIGN PATENT DOCUMENTS

| | | | |
|---|---|---|---|
| JP | 2000-097666 A | 4/2000 | |
| JP | 2000-146705 A | 5/2000 | |
| JP | 2005-244126 A | 9/2005 | |

\* cited by examiner

*Primary Examiner* — Thomas R Artman
(74) *Attorney, Agent, or Firm* — Rossi, Kimms & McDowell LLP

(57) ABSTRACT

A measurement apparatus, which measures a wavefront aberration of an optical system to be measured, comprises: a calculation unit configured to calculate the wavefront aberration based on an interference fringe generated by light which passed through the optical system to be measured; and a determination unit configured to calculate an evaluation value indicating a wavefront state based on the wavefront aberration calculated by the calculation unit, and determine the calculated wavefront aberration as the wavefront aberration of the optical system if the evaluation value falls within an allowable range.

6 Claims, 9 Drawing Sheets

F I G. 5
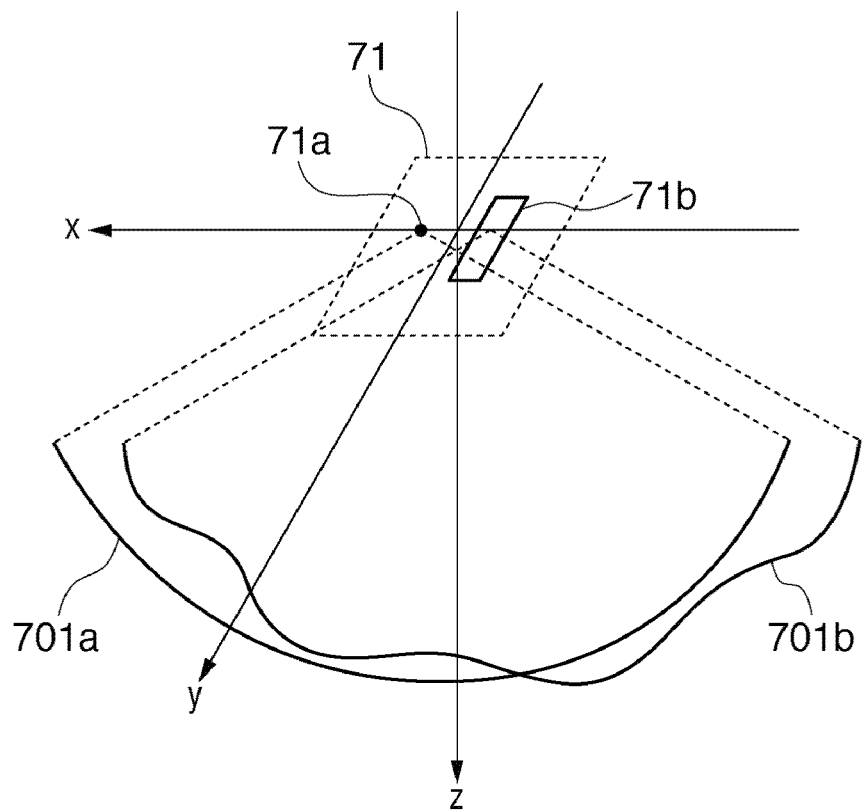
F I G. 6
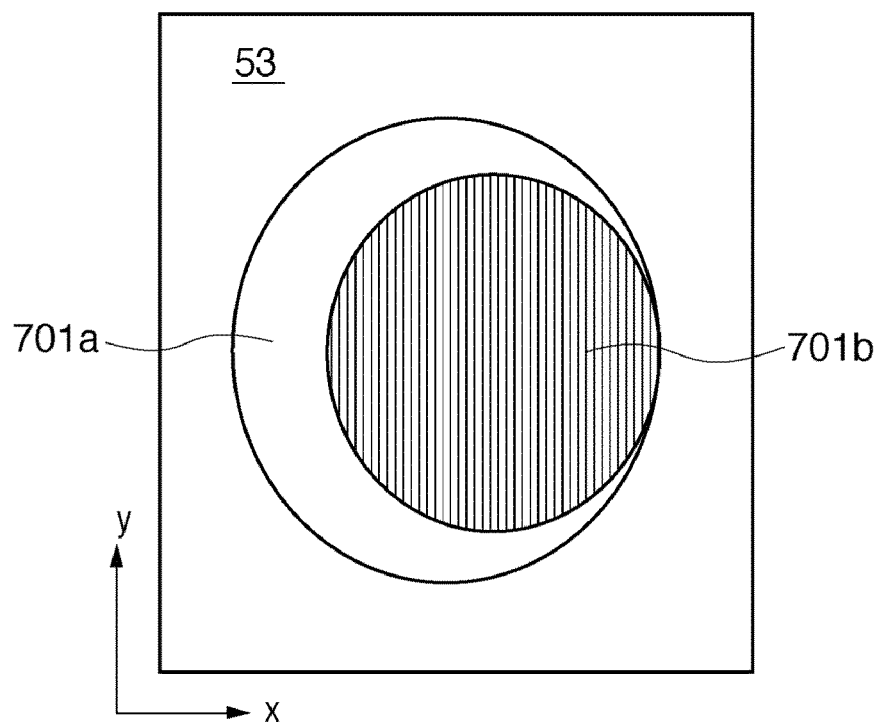

WAVEFRONT ABERRATION MEASUREMENT APPARATUS, EXPOSURE APPARATUS, AND METHOD OF MANUFACTURING DEVICE

BACKGROUND OF THE INVENTION

1. Field of the Invention

The present invention relates to a wavefront aberration measurement apparatus, an exposure apparatus, and a method of manufacturing a device.

2. Description of the Related Art

A projection exposure apparatus which transfers a pattern formed on a mask (e.g., a reticle) onto an exposure target has conventionally been employed to manufacture, by a photolithography process, devices, for example, semiconductor devices such as an integrated circuit and a large-scale integration, image sensing devices such as a charge-coupled device (CCD), display devices such as a liquid crystal panel, and magnetic heads. Since the exposure apparatus must precisely transfer the pattern on a reticle onto an exposure target at a predetermined magnification, it is important to use a projection optical system that has small aberrations and thus is excellent in imaging performance. This is especially important in recent years because the transfer patterns are becoming more sensitive to the aberration of an optical system in response to a demand for further advances in micropatterning of semiconductor devices. Under the circumstance, there has arisen a demand for correctly calculating the optical performance (e.g., the wavefront aberration) of a projection optical system with high accuracy.

One conventional method actually prints a mask pattern on a wafer and observes and inspects the obtained resist image by, for example, a scanning electron microscope (SEM). This method requires a long time for inspection including, for example, exposure and development, and has poor inspection reproducibility due to difficulties in operation of the SEM and errors based on the resist coating and development. In order to solve these problems, a point diffraction interferometer (PDI) having a pinhole to form an ideal spherical wave, and a shearing interferometer which exploits shearing interference have conventionally been known. Nowadays, a measurement apparatus which uses a line diffraction interferometer (LDI) having a slit to form an ideal cylindrical wave or an ideal elliptical wave has been proposed as well. Japanese Patent Laid-Open Nos. 2000-146705, 2000-097666, and 2005-244126, for example, disclose details of a PDI, a shearing interferometer, and an LDI.

When a wavefront aberration measurement apparatus mounted on an exposure apparatus is an LDI, a measurement mark (window/slit member) formed from a slit shape to form an ideal wavefront and a window shape to transmit a wavefront containing the aberration information of a projection optical system is formed on a plate disposed below the projection optical system. Also, a two-dimensional light-receiving element is disposed immediately beneath the above-mentioned plate. The two-dimensional light-receiving element senses interference between two wavefronts generated by the above-mentioned window/slit member. A wavefront aberration generated in the projection optical system is calculated by analyzing the sensed interference fringe image. The position of a lens group which constitutes the projection optical system is corrected based on the calculated wavefront aberration (the aberration values of the respective terms of Zernike polynomials), thereby maintaining the optical performance of the projection optical system with high accuracy.

However, if dirt is adhering on the measurement mark or the measurement position is shifted, no interference fringes are generated in the entire range of the numerical aperture (NA), so an interference fringe image in which fringe information has local defects is obtained. In this case, the wavefront aberration (the aberration values of the respective terms of Zernike polynomials) calculated from the above-mentioned interference fringe image has errors. When the projection optical system is corrected based on the erroneous aberration values, this results in deterioration in optical performance. The above-described discussion is not limited to an LDI and holds true for all optical performance measurement apparatus, which measure the optical performances of optical systems to be measured, such as a PDI and a shearing interferometer.

SUMMARY OF THE INVENTION

The present invention provides a measurement apparatus which can precisely, efficiently measure the wavefront aberration.

According to the present invention, there is provided a measurement apparatus which measures a wavefront aberration of an optical system to be measured, the apparatus comprising: a calculation unit configured to calculate the wavefront aberration based on an interference fringe generated by light which passed through the optical system to be measured; and a determination unit configured to calculate an evaluation value indicating a wavefront state based on the wavefront aberration calculated by the calculation unit, and determine the calculated wavefront aberration as the wavefront aberration of the optical system if the evaluation value falls within an allowable range.

Further features of the present invention will become apparent from the following description of exemplary embodiments with reference to the attached drawings.

BRIEF DESCRIPTION OF THE DRAWINGS

FIG. 5 is a schematic view showing light emerging from a mark in the second mask shown in FIG. 3;

FIG. 6 is a schematic view illustrating one example of interference fringes of light, which are detected by an image sensing device shown in FIG. 1;

DESCRIPTION OF THE EMBODIMENTS

First Embodiment

Figure 1:
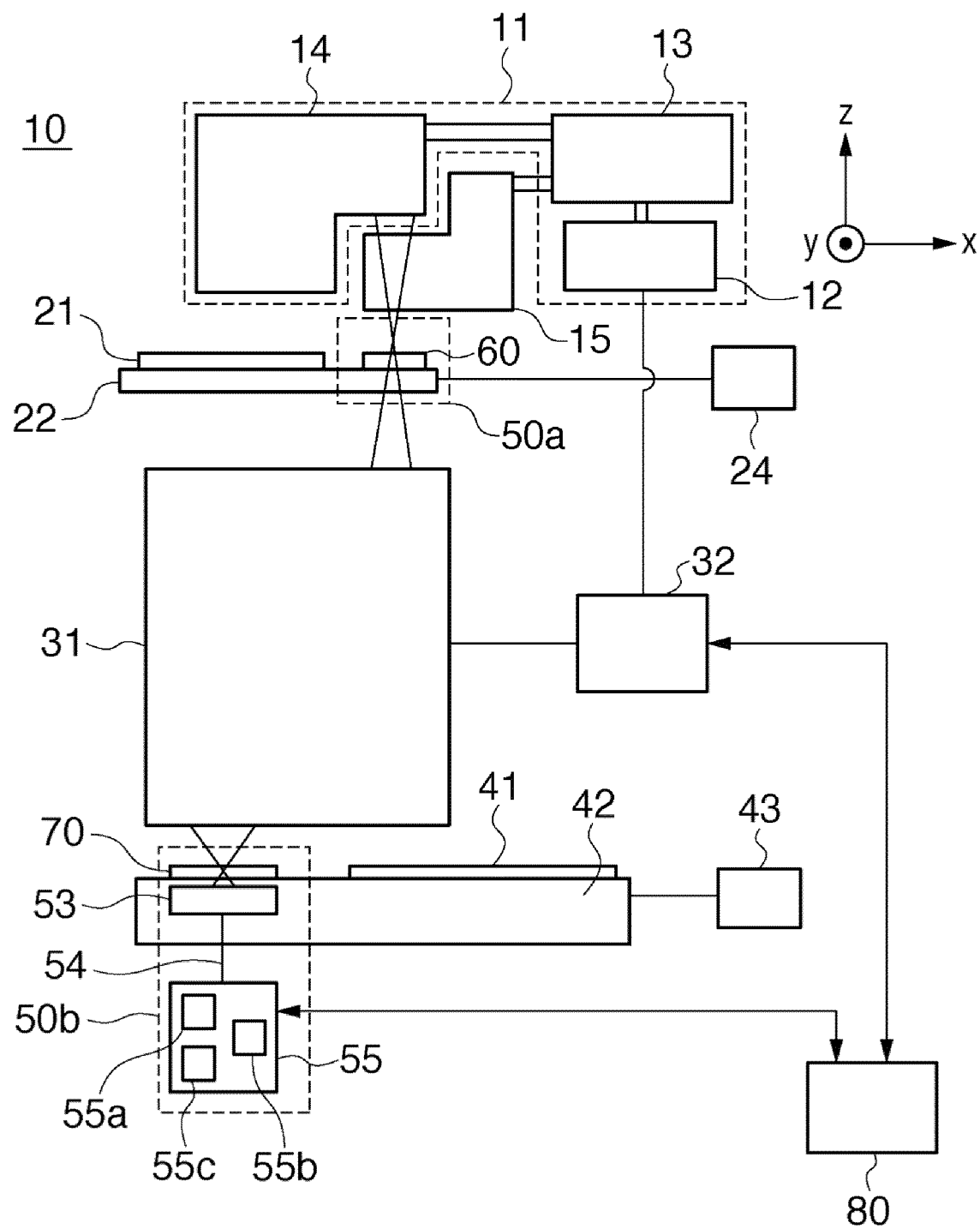
FIG. 1 is a schematic block diagram showing an exposure apparatus including a measurement apparatus.

An exposure apparatus 10 including a measurement apparatus of the PDI scheme in the first embodiment of the present invention will be described below with reference to the accompanying drawings. The exposure apparatus 10 shown in FIG. 1 is a projection exposure apparatus which transfers a circuit pattern formed on a mask 21 onto an exposure target (wafer) 41 by exposure using, for example, the step & scan scheme or the step & repeat scheme. This exposure apparatus is suitable for a lithography process on the submicron order or on the order of quarter microns or less. An exposure apparatus of the step & scan scheme (also called a "scanner") will be exemplified below in this embodiment. The "step & scan scheme" means herein an exposure method in which the pattern of a mask is transferred onto a wafer by exposure while continuously scanning the wafer with respect to the mask, and a wafer stage 42 is moved in steps to the next exposure region after the end of exposure of one shot. The "step & repeat scheme" means herein an exposure method in which a wafer is moved in steps to the exposure region in the next shot for each full-field exposure of the wafer.

The exposure apparatus 10 mounts measurement apparatus 50a and 50b, and includes an illumination system 11, the mask 21, a projection optical system 31, and the wafer 41. The illumination system 11 includes a light source unit 12, relay optical system 13, and illumination optical system 14. The light source unit 12 can use, for example, an ArF excimer laser with a wavelength of about 193 nm or a KrF excimer laser with a wavelength of about 248 nm as a light source. However, the type of laser is not limited to an excimer laser, and the number of lasers is not limited, either. When the light source unit 12 uses a laser, it is possible to use an optical system that shapes a collimated light beam from the laser light source into a desired beam shape, and an optical system that converts a coherent laser light beam into an incoherent light beam. The light source, which can be used for the light source unit 12, is not limited to a laser, and one or a plurality of lamps such as mercury lamps or xenon lamps can also be used. The illumination system 11 is an optical system which illuminates the mask 21, and includes, for example, a lens, mirror, optical integrator, and σ stop. The relay optical system 13 guides a light beam from the light source unit 12 to the illumination optical system 14 and an alignment optical system 15. The illumination optical system 14 is configured such that optical elements such as a condenser lens, fly-eye lens, aperture stop, condenser lens, slit, and imaging optical system align themselves in this order. The alignment optical system 15 includes an alignment scope and is retracted outside the optical path during normal exposure. FIG. 1 does not illustrate a driving mechanism which drives the alignment optical system 15. The alignment scope aligns the mask 21 and the wafer 41 by imaging an alignment mark (not shown) on the mask 21 and that on the wafer stage 42 via the projection optical system 31. The mask (or the reticle) 21 is made of, for example, quartz, has a circuit pattern (or an image) to be transferred formed under its surface layer, and is supported and driven by a mask stage (or a reticle stage) 22. Light diffracted by the mask 21 is projected onto the wafer 41 upon passing through the projection optical system 31. The mask 21 and the wafer 41 are optically conjugate to each other. Since the exposure apparatus 10 according to the first embodiment is a scanner, it transfers the pattern of the mask 21 onto the wafer 41 by scanning them at a speed ratio equal to the reduction magnification ratio. Note that an exposure apparatus of the step & repeat scheme (also called a "stepper") performs exposure while the mask 21 and the wafer 41 stand still.

The projection optical system 31 can be, for example, a refractive optical system including only a plurality of lens elements, a catadioptric system including pluralities of lens elements and mirrors, an optical system including a plurality of lens elements and a diffraction optical element such as a kinoform, or an optical system including only mirrors. When chromatic aberration correction is necessary, a plurality of lens elements made of glass materials with different degrees of dispersion (Abbe numbers) are used, or the diffraction optical element is configured to generate dispersion in a direction opposite to that generated by the lens elements. The measurement apparatus 50a and 50b measure the optical performance (e.g., the wavefront aberration) of the projection optical system 31. The wafer 41 is a processing object and is coated with a photoresist. The wafer 41 is held by the wafer stage 42 via a chuck (not shown). The wafer stage 42 supports the wafer 41 and part of the measurement apparatus 50b. The wafer stage 42 can take any form known to those skilled in the art, and a detailed description of its structure and operation will not be given herein. For example, the wafer stage 42 can move the wafer 41 and part of the measurement apparatus 50b in the X and Y directions using a stage controller 43. The mask 21 and the wafer 41 are, for example, scanned in synchronism with each other, and the wafer stage 42 and mask stage 22 have their positions calibrated by the alignment optical system 15 and are then driven at a constant speed ratio using, for example, a mask stage controller 24 and stage controller 43.

The measurement apparatus 50a and 50b shown in FIG. 1 include the illumination optical system 14, a first mask 60, a second mask 70, an image sensing device 53, a communication cable 54, and a measurement apparatus controller 55. The first mask 60 and second mask 70 serve as pattern members which generate interference fringes. In the first embodiment, the measurement apparatus 50a and 50b include an interferometer of the PDI scheme, which measures the wavefront aberration of the projection optical system 31 as an optical system to be measured by detecting interference fringes. In the first embodiment, the first mask 60 is placed on the mask stage 22. The first mask 60 as in this case is made of a transparent substrate such as quartz or fluorite and formed by attaching, for example, chromium onto one surface of the substrate. A light beam from the illumination optical system 14 is converged on the first mask 60 placed on the mask stage 22. The converged light beam forms illumination which satisfies σ=1, which equals a numerical aperture NAo of the projection optical system 31 on the reticle side, in other words, on the object side.

Figure 2:
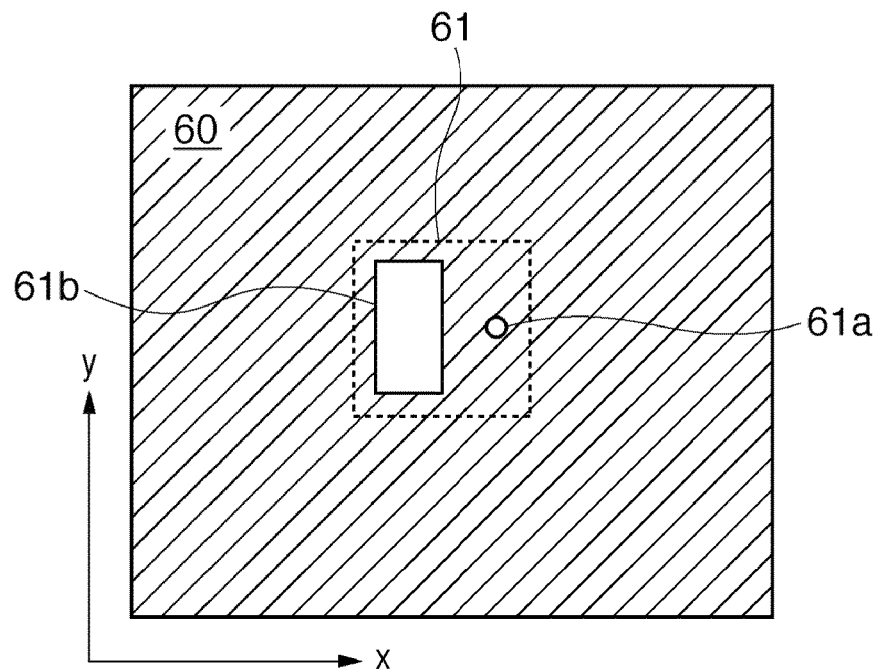
FIG. 2 is a schematic plan view showing a first mask in the first embodiment.

FIG. 2 shows the structure of the first mask 60. The first mask 60 includes a pair of a pinhole 61a and a window 61b. Letting NAo be the numerical aperture of the projection optical system 31 on the reticle side, in other words, on the object side, the pinhole 61a has a diameter Δr which satisfies:

$$\Delta r < 0.5 \times \lambda / NAo \quad (1)$$

where λ is the wavelength of the exposure light.

Determining the diameter Δr of the pinhole 61a to satisfy inequality (1) allows the light diffracted by the pinhole 61a to be in phase within the range of the numerical aperture NAo. On the other hand, a width Δr' of the window 61b in the x direction is equal to or narrower than λ/NAo. The width Δr' may be set to roughly fall within the range defined by inequality (1). However, because the light having passed through the window 61b passes through a pinhole with a diameter which satisfies inequality (1) on the wafer side, it need not be in phase on the reticle side, as will be described later. Hence, the width Δr' is set relatively wide from the viewpoint of ensuring a given light amount.

Figure 3:
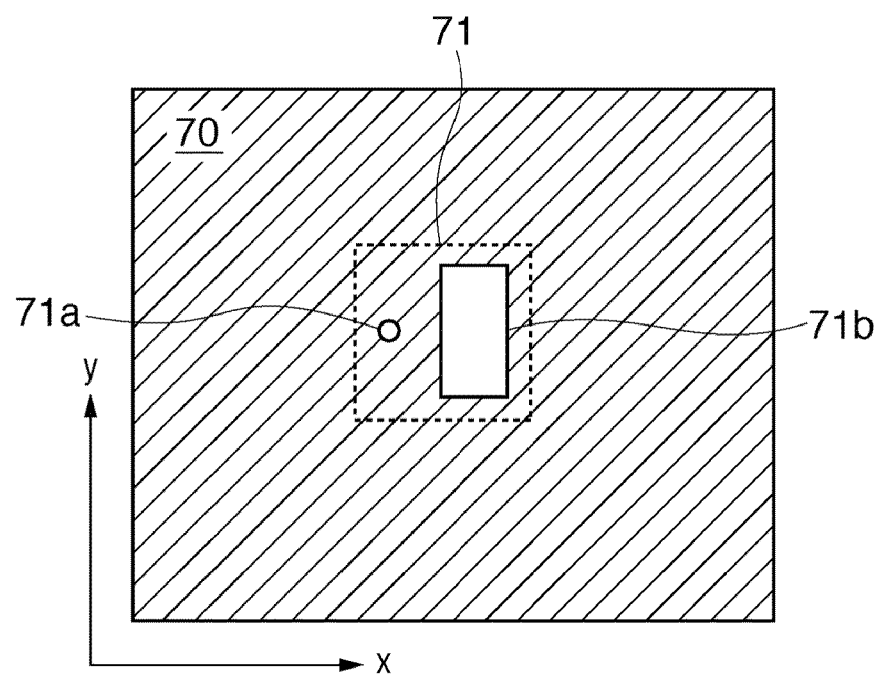
FIG. 3 is a schematic plan view showing a second mask in the first embodiment.

The second mask 70 includes a pair of a pinhole 71a and a window 71b, as shown in FIG. 3. Letting NAi be the numerical aperture of the projection optical system 31 on the wafer side, in other words, on the image side, the pinhole 71a has a diameter Δw which satisfies:

$$\Delta w < 0.5 \times \lambda/NAi \qquad (2)$$

Determining the diameter Δw of the pinhole 71a to satisfy inequality (2) allows the light diffracted by the pinhole 71a to have an in-phase spherical wavefront within the range of the numerical aperture NAi.

A width Δw' of the window 71b in the x direction is determined based on the spatial frequency of the projection optical system to be measured. The width Δw' is set wide if high frequencies are desirably measured, and is set narrow if low frequencies need only be measured. Letting f be the spatial frequency of the pupil of the projection optical system 31, the width Δw' is given by:

$$\Delta w' = 2 \times f \times \lambda/NAi \qquad (3)$$

Note that the spatial frequency f of the wavefront aberration, which has one period equal to the pupil radius, is assumed to be 1.

The image sensing device 53 includes a photoelectric conversion device such as a CCD. The communication cable 54 connects the image sensing device 53 and the measurement apparatus controller 55 so that they can communicate with each other. The measurement apparatus controller 55 includes a calculation unit 55a, determination unit 55b, and memory unit 55c. The calculation unit 55a calculates the wavefront aberration based on interference fringes sensed by the image sensing device 53. The memory unit 55c stores a data group including pieces of parameter information (e.g., the NA value and the distance between the second mask 70 and the image sensing device 53) necessary to calculate the wavefront aberration, and the calculation results (e.g., the wavefront aberration data and the respective terms of Zernike polynomials). A Fourier transform method or an electronic moiré method, for example, is used to calculate phase information by the calculation unit 55a. The Fourier transform method acquires phase information by two-dimensionally Fourier-transforming a single interference fringe image, extracting a spatial frequency range containing the information of a wavefront to be measured, performing an origin shift, and inversely Fourier-transforming the information. Also, the electronic moiré method generates at least three reference grating images which have the same carrier frequency as that of a single measured interference fringe image and have been phase-shifted from each other. Then, this method acquires phase information by processing using a low-pass filter and phase shift method for the at least three moiré fringes generated from the measured interference fringe image and the above-mentioned reference grating images. When the electronic moiré method is used, the above-mentioned processing can be done by multiplying sensed interference fringes by reference grating images stored in the memory in the measurement apparatus controller 55.

The wavefront aberration information of the projection optical system 31 stored in the memory unit 55c is sent to a main controller 80. The main controller 80 calculates a lens driving amount and wavelength driving amount necessary for wavefront aberration correction based on the received wavefront aberration information, and outputs the calculation results to a projection system controller 32. The projection system controller 32 can cause the projection optical system 31 to generate a desired amount of wavefront aberration by controlling lens driving systems set in several portions on the plurality of lenses which constitute the projection optical system 31 and controlling the wavelength of exposure light oscillated by the light source unit 12. The projection system controller 32 displaces the plurality of lenses in the projection optical system 31 in accordance with the lens driving amount input from the main controller 80. Moreover, the projection system controller 32 changes the wavelength of exposure light, oscillated by the light source unit 12, in accordance with the input wavelength driving amount.

Figure 4:
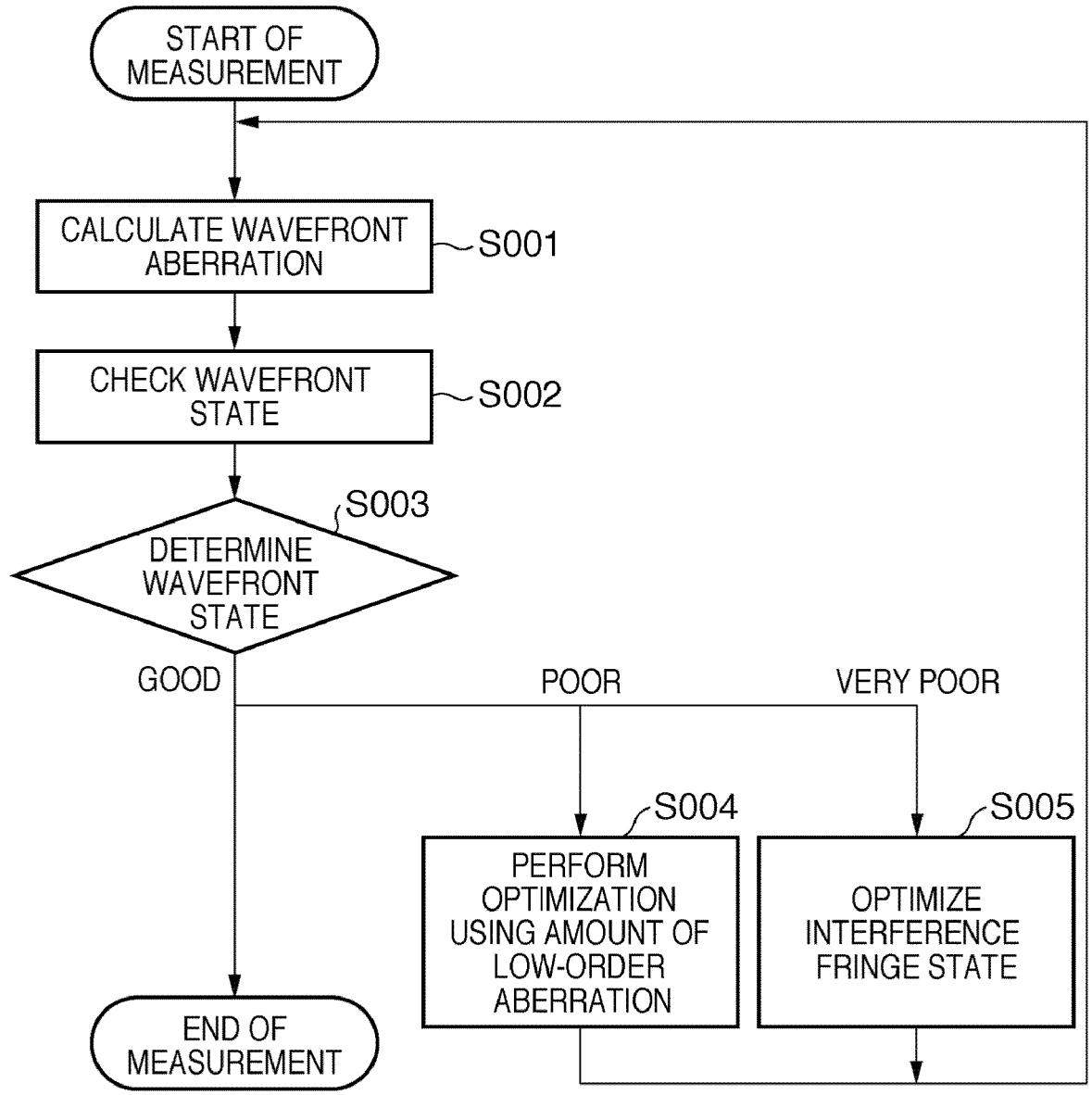
FIG. 4 is a flowchart showing a wavefront aberration measurement operation in the first embodiment.

FIG. 4 is a flowchart showing a method of measuring the wavefront aberration of the projection optical system 31 in this embodiment. Note that the projection optical system 31 serves as an optical system to be measured, whose wavefront aberration is measured by the measurement apparatus. The flowchart shown in FIG. 4 includes step S001 to calculate the wavefront aberration, step S002 to check the wavefront state, step S003 to determine the wavefront state, step S004 to perform optimization using the amount of low-order aberration, and step S005 to optimize the interference fringe state. In step S001, the mask stage controller 24 adjusts the positions of the illumination optical system 14 and first mask 60 so that a light beam emitted by the light source unit 12 strikes only a mark 61 in the first mask 60 via the σ stop in the illumination optical system 14 after being guided to the illumination optical system 14. At this time, because the pinhole 61a has a width which satisfies inequality (1), the light emerging from the pinhole 61a becomes diffracted light with an in-phase spherical wavefront and irradiates the entire optical pupil plane of the projection optical system 31. On the other hand, the light beam having passed through the window 61b becomes that which contains the aberration information of the illumination optical system 14.

The stage controller 43 adjusts the position of the wafer stage 42 so that the light emerging from the mark 61 in the first mask 60 forms an image on a mark 71 in the second mask 70 via the projection optical system 31. With this operation, the pinhole 61a in the first mask 60 is imaged on the window 71b in the second mask 70, and the window 61b in the first mask 60 is imaged on the pinhole 71a in the second mask 70. A light beam diffracted by the pinhole 71a has an in-phase spherical wavefront. On the other hand, a wavefront transmitted through the window 71b contains the aberration information of the projection optical system 31 because it is transmitted through the projection optical system 31 after being shaped into a wavefront in phase in the x direction by the pinhole 61a. Note that the first mask 60 and second mask 70 serve as pattern members which generate interference fringes.

FIG. 5 is a schematic view showing light beams emerging from the pinhole 71a and window 71b. As can be seen from FIG. 5, the light having passed through the pinhole 71a has a spherical ideal wavefront 701a, and that having passed through the window 71b has a wavefront 701b to be measured. FIG. 6 illustrates one example of interference fringes of light emerging from the pinhole 71a and window 71b, which are detected by the image sensing device 53. Two images of the pupil of the projection optical system 31, whose centers are shifted from each other by the interval between the pinhole 71a and the window 71b, are sensed, and interference fringes are generated in their overlapping region. The generated interference fringes are sensed by the image sensing device 53, and their phase information is calculated by the calculation unit 55a. The calculated phase information is stored in the memory unit 55c as wavefront aberration data. In step S002 to check the wavefront state, the determination unit 55b calculates an evaluation value indicating the wavefront state based on the wavefront aberration data stored in step S001. The wavefront aberration data generated by the calculation unit 55a is, for example, data in which values indicating wavefronts are mapped at two-dimensionally arrayed evaluation points.

Figure 7:
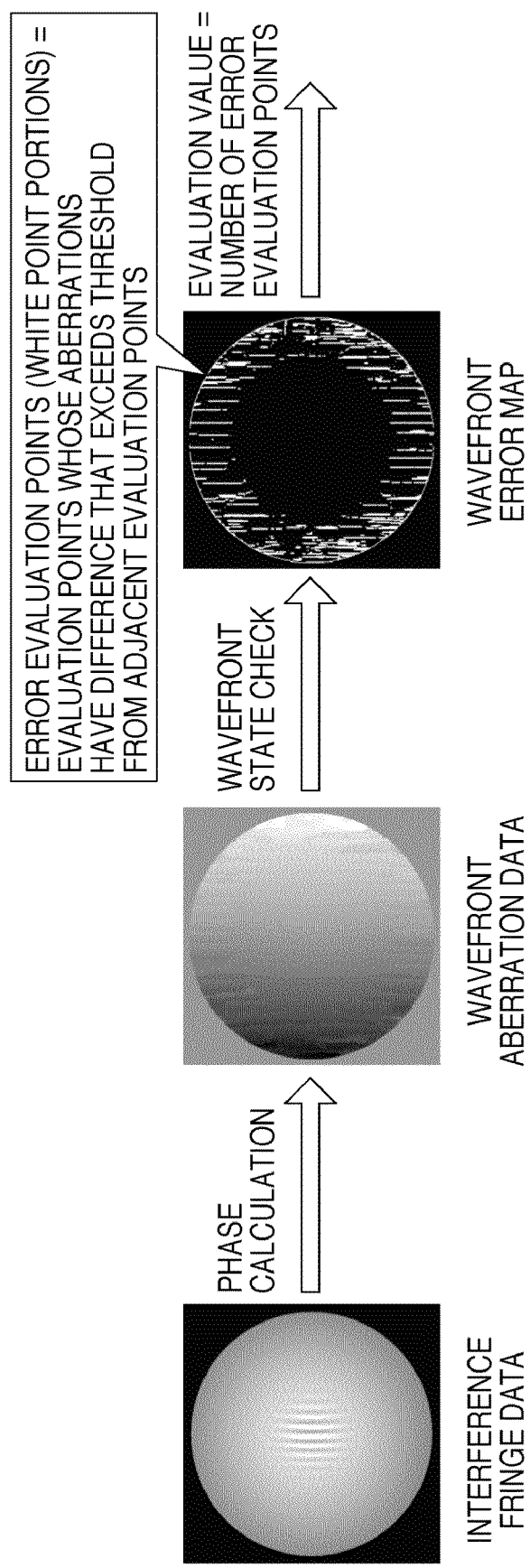
FIG. 7 is a conceptual view showing the processing contents in step S002 in FIG. 4.

FIG. 7 is a conceptual view showing the processing in step S002. Referring to FIG. 7, the determination unit 55b checks the wavefront state for the wavefront aberration data (a central image in FIG. 7) calculated in step S001 to calculate a wavefront error map (a right image in FIG. 7). The determination unit 55b determines, for example, whether each evaluation point has a wavefront aberration amount difference that exceeds a threshold from those of at least one evaluation points among a plurality of evaluation points in the wavefront aberration data, and determines, as error evaluation points (white portions in the right image of FIG. 7), evaluation points whose wavefront aberration amounts have a difference from neighboring evaluation points, that exceeds the threshold. An optimum value is set to the above-mentioned threshold of difference in advance in accordance with the measurement environment. The above-mentioned threshold may take a value fixed over the entire NA range (e.g., 500 mλ over the entire range), or may take a value which differs for each evaluation point (e.g., 200 mλ in the range of NA≦0.5, and 800 mλ in the range of NA>0.5). The determination unit 55b performs the above-mentioned error determination for the entire NA range to obtain all error evaluation points. The total number of error evaluation points is an evaluation value indicating the wavefront state. The above-mentioned evaluation value (the total number of error evaluation points) increases as the number of defective portions of interference fringes increases due to, for example, a shift in measurement position and adhesion of dirt on the measurement mark.

Figure 8:
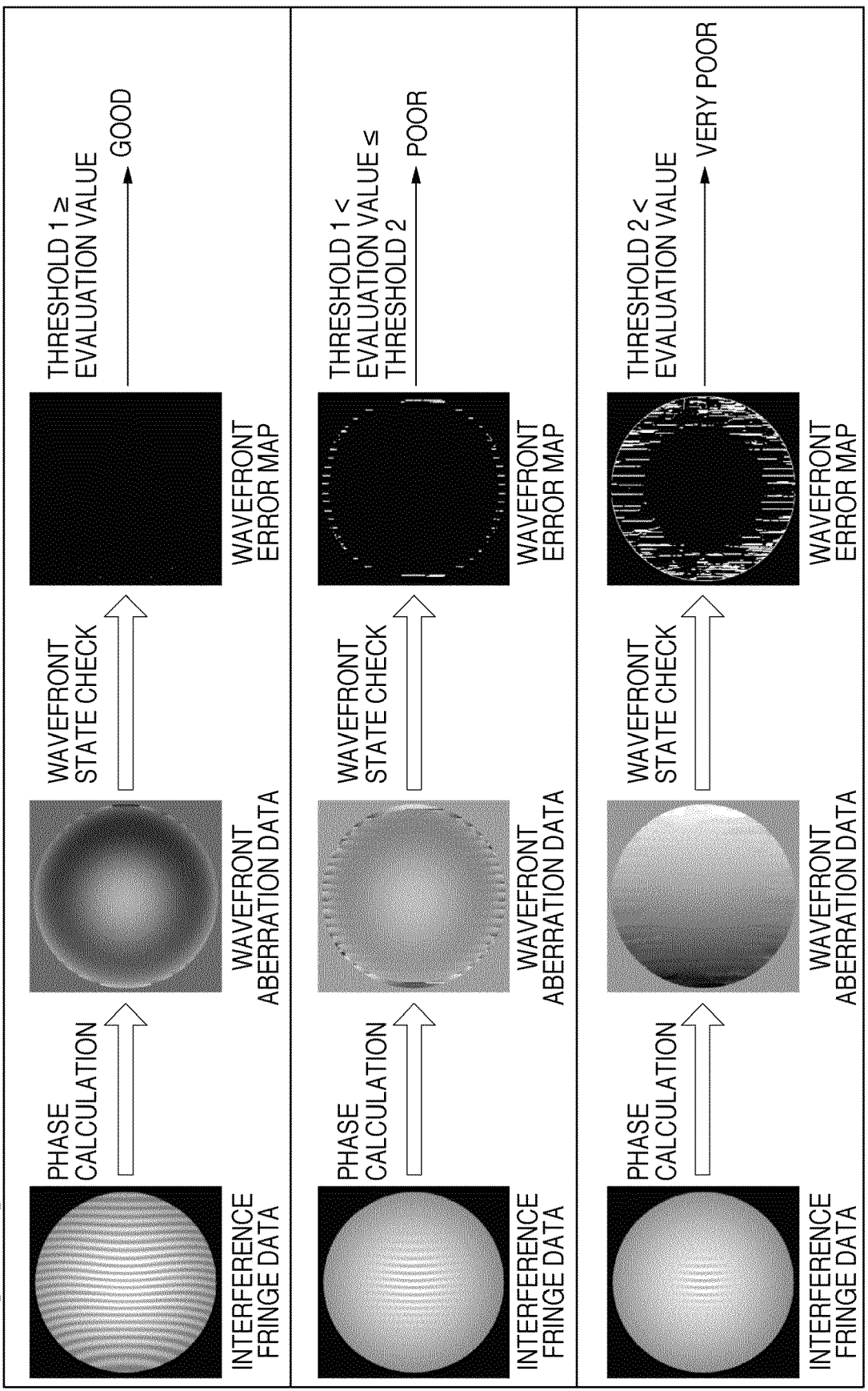
FIG. 8 is a conceptual view illustrating one example of the wavefront states determined in step S002 in FIG. 4.

In step S003 to determine the wavefront state, the determination unit 55b determines whether the evaluation value calculated in step S002 falls within an allowable range. For example, the determination unit 55b compares the calculated evaluation value with two preset thresholds (e.g., threshold 1=600 and threshold 2=5000) to determine the wavefront state. The above-mentioned thresholds may be arbitrarily set in accordance with the installation environment of the measurement apparatus and the required measurement accuracy. FIG. 8 illustrates one example of the results of determining the wavefront state by the determination unit 55b. FIG. 8 shows determination results each classified into "good (first rank)", "poor (second rank)", or "very poor (third rank)". "Poor (second rank)" is inferior in wavefront state to "good (first rank)", and "very poor (third rank)" is inferior in wavefront state to "poor (second rank)". If "evaluation value≦threshold 1", the determination unit 55b classifies the wavefront state into "good" and determines the wavefront aberration measurement result as the wavefront aberration of the projection optical system 31, which can be fed back to the projection system controller 32. In this case, since the wavefront can be measured in a satisfactory state, the wavefront aberration measurement ends. If "threshold 1<evaluation value≦threshold 2", the determination unit 55b classifies the wavefront state into "poor". Then, the determination unit 55b determines that components of specific orders (low-order components) of the wavefront aberration expanded into polynomials have a reliable level although the measurement results of high-order aberrations of the wavefront aberration have low reliability and therefore cannot be fed back to the projection system controller 32. Hence, to correct the position of the second mask based on low-order aberration components (components of the second to fourth terms of Zernike polynomials into which the wavefront aberration is expanded) of the wavefront aberration, it is only necessary to advance the process to step S004 to change the wafer stage measurement position in the x, y, and z directions. If "threshold 2<evaluation value", the determination unit 55b classifies the wavefront state into "very poor" and determines that the measurement results cannot be used and have no reliability. In this case, it is only necessary to advance the process to step S005 to optimize the interference fringe state by detecting a position where the interference fringe generation state is optimum while oscillating the wafer stage measurement position in the x, y, and z directions.

In step S004 to perform optimization using low-order aberrations, the determination unit 55b calculates correction amounts for the x, y, and z positions of the wafer stage from the measurement results of the calculated low-order aberrations. Correction amounts Xcorr, Ycorr, and Zcorr for the x, y, and z positions can be calculated using, for example:

$$Xcorr = Cx \times (Z2 - Zi2)$$

$$Ycorr = Cy \times (Z3 - Zi3)$$

$$Zcorr = Cz \times (Z4 - Zi4) \quad (4)$$

where Z2, Z3, and Z4 are the measurement values of aberrations of the second to fourth Zernike terms, Zi2, Zi3, and Zi4 are the initial values (the values upon initial adjustment) of aberrations of the second to fourth Zernike terms, and Cx, Cy, and Cz are the coefficients of the sensitivities of the measurement positions to the respective aberration values. The position where the wavefront aberration is to be measured again is determined by driving the wafer stage position by the correction amounts calculated by equations (4).

Figure 9:
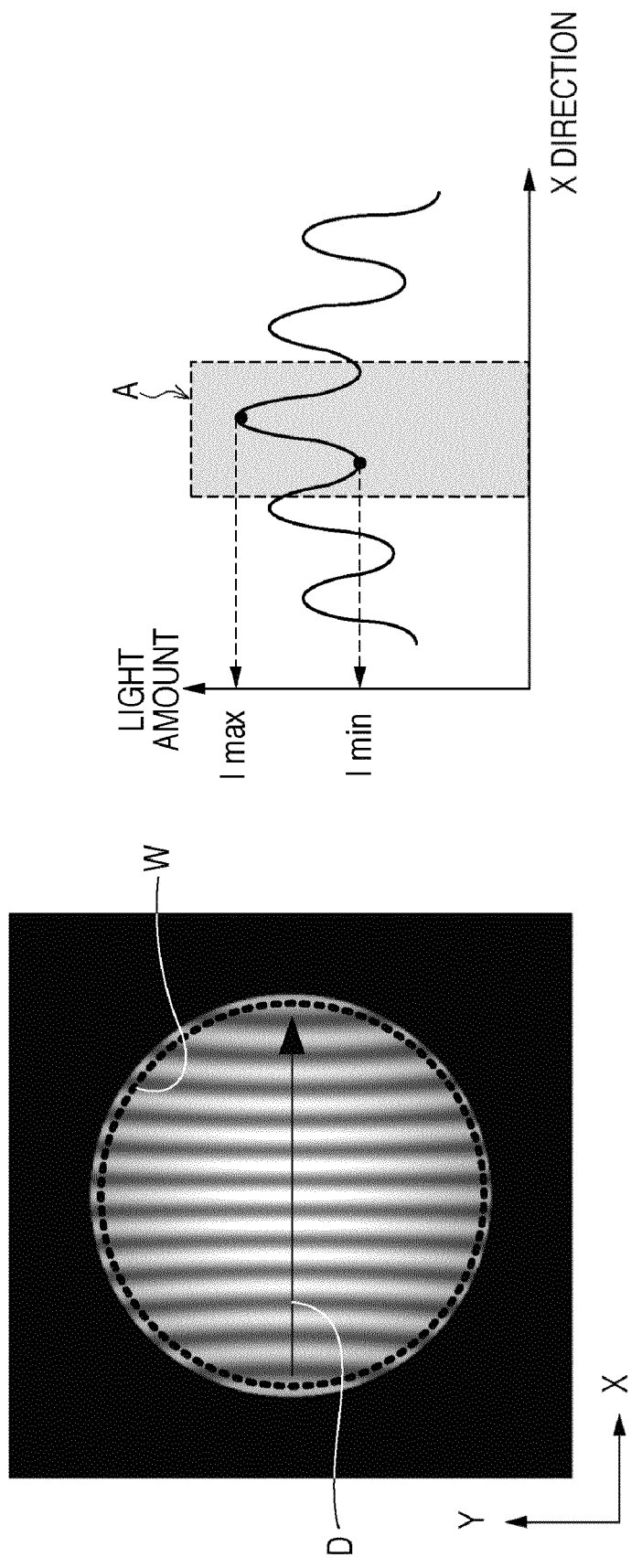
FIG. 9 is a schematic view illustrating one example of a visibility calculation method in the first embodiment.

In step S005 to optimize the interference fringe state, interference fringes are sensed while changing the position of the second mask 70 by oscillating the wafer stage position in the x, y, and z directions. The determination unit 55b calculates visibility values from a plurality of patterns of sensed interference fringes, and determines, as the measurement position, the x, y, and z positions of the wafer stage where a maximum visibility value is obtained. The visibility calculation of the determination unit 55b uses, for example, the following method. A left image in FIG. 9 shows one example of image data of interference fringes sensed by the image sensing device 53. An arrow D in the above-mentioned image data indicates the processing direction for visibility calculation. In this case, interference fringes are generated in the X direction, so the processing direction is the X direction. A region within a frame indicated by a dotted line W indicates the visibility calculation region. A right graph in FIG. 9 is obtained by graphing the light amount values on an arbitrary line in the left image of FIG. 9. The abscissa indicates the pixel position, and the ordinate indicates the light amount value. In a visibility calculation region A indicated by a hatched portion in the right graph of FIG. 9, a visibility value V is calculated using:

$$V = (I\max - I\min)/(I\max + I\min) \quad (5)$$

where Imax is the light intensity in a light portion (the maximum value of the light amount), and Imin is the light intensity in a dark portion (the minimum value of the light amount). The width of the visibility calculation region A is preset as the value of "the pitch of interference fringes calculated from the design values of the measurement apparatus (50a and 50b)"+α.

The above-mentioned visibility value V can be calculated by scanning the position of the visibility calculation region A in the processing direction D. After the above-mentioned processing is performed for each line, the average of the visibility values at all pixel positions in the visibility calculation region indicated by the dotted line W in the left image of FIG. 9, or the value calculated using the pTile method, for example, can be ultimately determined as the visibility value of interference fringes.

After the wafer stage position is driven to an optimum measurement position in step S004 or S005, S001 to measure the wavefront aberration is executed again. At this time, because the measurement position has been corrected, a wavefront state of a measurement result is better than that of the measurement result obtained by executing step S001 previously. A final wavefront aberration measurement result is obtained at an optimum measurement position by repeating the above-mentioned steps S001 to S005 a predetermined number of times. Assume that "good" is not determined for the wavefront state even by repeating steps S001 to S005 a predetermined number of times. In this case, it is only necessary to, for example, change the measurement mark by taking account of factors such as deterioration of the measurement mark or adhesion of dirt on it, or inspect the measurement apparatus 50a and 50b again.

A conventional method of evaluating the wavefront aberration based on the visibility of interference fringes often determines that wavefront aberration calculation that is in fact possible is impossible. In addition, the conventional method of evaluating the wavefront aberration based on the visibility of interference fringes may erroneously determine that the visibility is high when a white pixel is generated as dirt adheres onto the measurement mark. In contrast, the measurement apparatus in this embodiment can prevent such a trouble.

The use of the wavefront aberration measurement apparatus in this embodiment makes it possible to prevent erroneous wavefront aberration measurement. In addition, if the measurement position is inappropriate, measurement is performed after the measurement position is automatically adjusted into an optimum position. This makes it possible to measure the wavefront aberration with higher stability and higher accuracy than in the prior arts.

Second Embodiment

Figure 10:
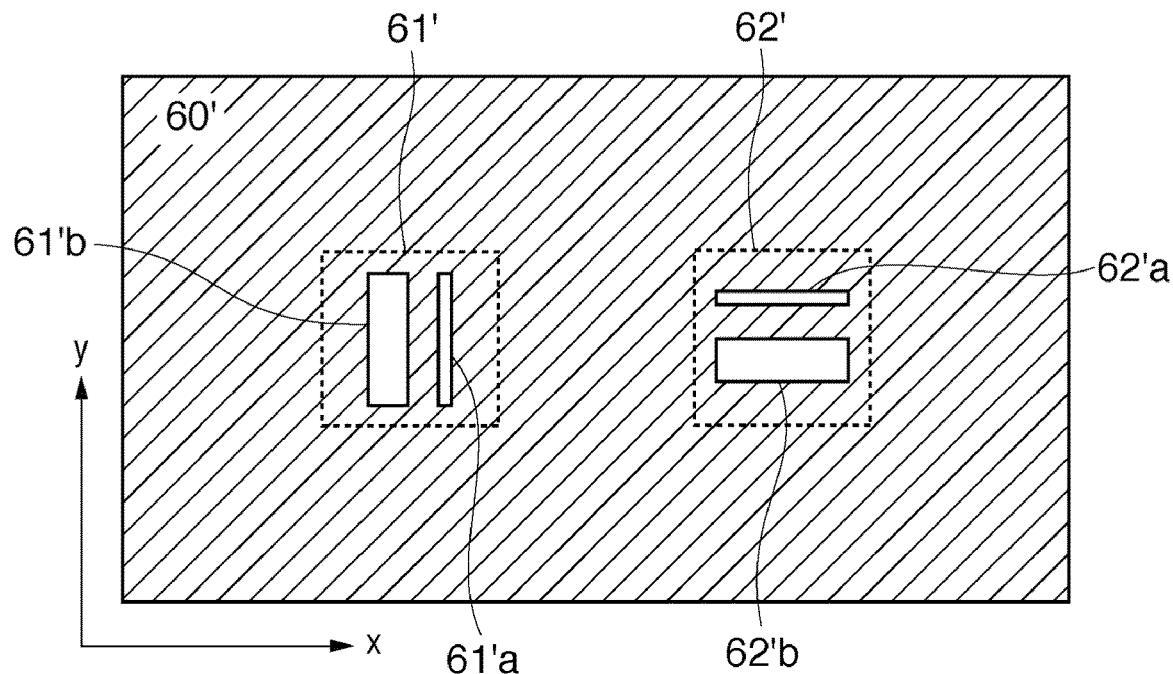
FIG. 10 is a schematic plan view showing a first mask in the second embodiment.

An exposure apparatus 10 including a measurement apparatus of the LDI scheme in the second embodiment of the present invention will be described with reference to the accompanying drawings. Schematic views in the second embodiment are roughly the same as in the first embodiment shown in FIG. 1, but they are different only in that in the latter the first mask 60 is substituted by a first mask 60' and the second mask 70 is substituted by a second mask 70'. FIG. 10 shows the structure of the first mask 60'. The first mask 60' includes a mark 61' formed from a slit 61'a and window 61'b oriented in the 0° direction, and a mark 62' formed from a slit 62'a and window 62'b oriented in the 90° direction. The two marks are the same in, for example, width and interval and are different only in arrangement orientation. Letting NAo be the numerical aperture of a projection optical system 31 on the reticle side, in other words, on the object side, the slits 61'a and 62'a have a width Δr determined by inequality (1). Determining the width of the slits 61'a and 62'a to satisfy inequality (1) allows light diffracted by them to be in phase within the range of the numerical aperture NAo. On the other hand, a width Δr' of the windows 61'b and 62'b is equal to or narrower than λ/NAo. The width Δr' may be set to roughly fall within the range defined by inequality (1). However, because the light having passed through the window 61'b and 62'b passes through a slit with a width which satisfies inequality (1) on the wafer side, it need not be in phase on the reticle side, as will be described later. Hence, the width Δr' is set relatively wide from the viewpoint of ensuring a given light amount.

Figure 11:
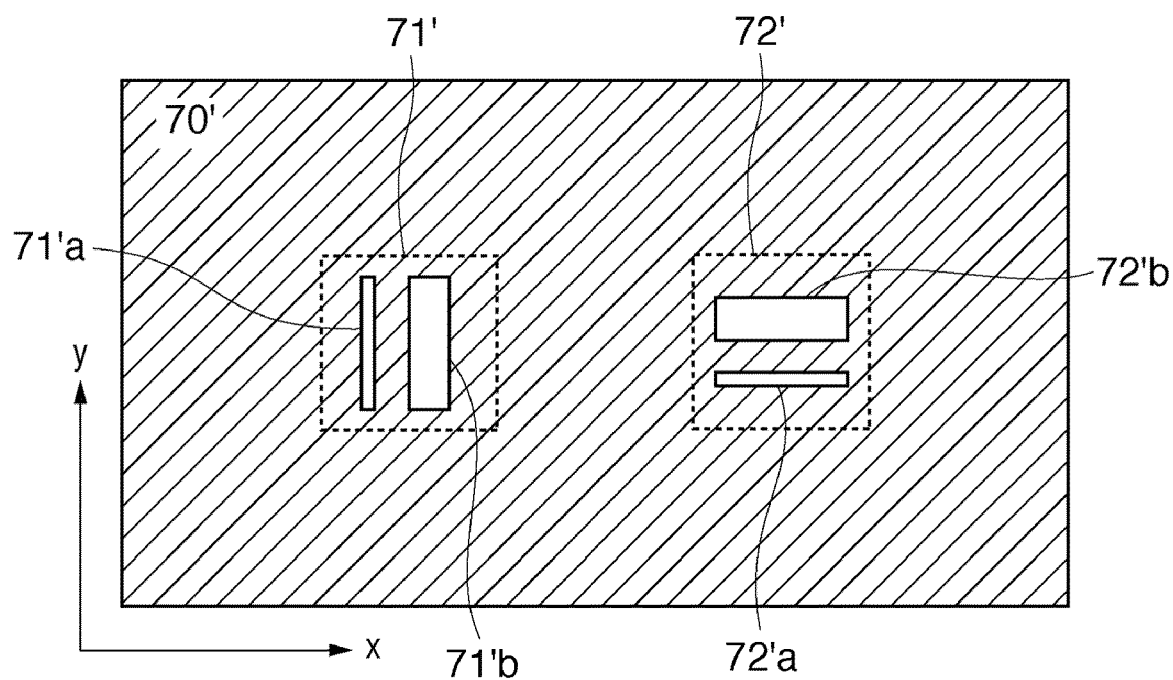
FIG. 11 is a schematic plan view showing a second mask in the second embodiment.

FIG. 11 is a schematic plan view showing the second mask 70'. The second mask 70' includes a mark 71' formed from a slit 71'a and window 71'b oriented in the 0° direction (Y direction), and a mark 72' formed from a slit 72'a and window 72'b oriented in the 90° direction (X direction), as shown in FIG. 11. The marks 71' and 72' are the same in, for example, width and interval and are different only in arrangement orientation. Letting NAi be the numerical aperture of the projection optical system 31 on the wafer side, in other words, on the image side, the slits 71'a and 72'a have a width Δw which satisfies inequality (2). Determining the width of the slits 71'a and 72'a to satisfy inequality (2) allows light diffracted by them to be in phase within the range of the numerical aperture NAi. A width Δw' of the windows 71'b and 72'b is determined based on the spatial frequency of the projection optical system to be measured. The width Δw' is set wide if high frequencies are desirably measured, and is set narrow if low frequencies need only be measured. Letting f be the spatial frequency of the pupil of the projection optical system 31, the width Δw' is given by equation (3). The longer a length Lw of the slits and windows, the more appropriate the light amount obtained becomes. Nevertheless, the length Lw needs to fall within a region in which the aberration of the projection optical system 31 is uniform (a so-called isoplanatic region). For the sake of descriptive convenience, the marks 61' and 71' will often be referred to as X marks, and the marks 62' and 72' will often be referred to as Y marks in the following discussion. Also, interference fringes formed by the X mark and the Y mark will be referred to as X interference fringes and Y interference fringes, respectively, hereinafter.

Figure 12:
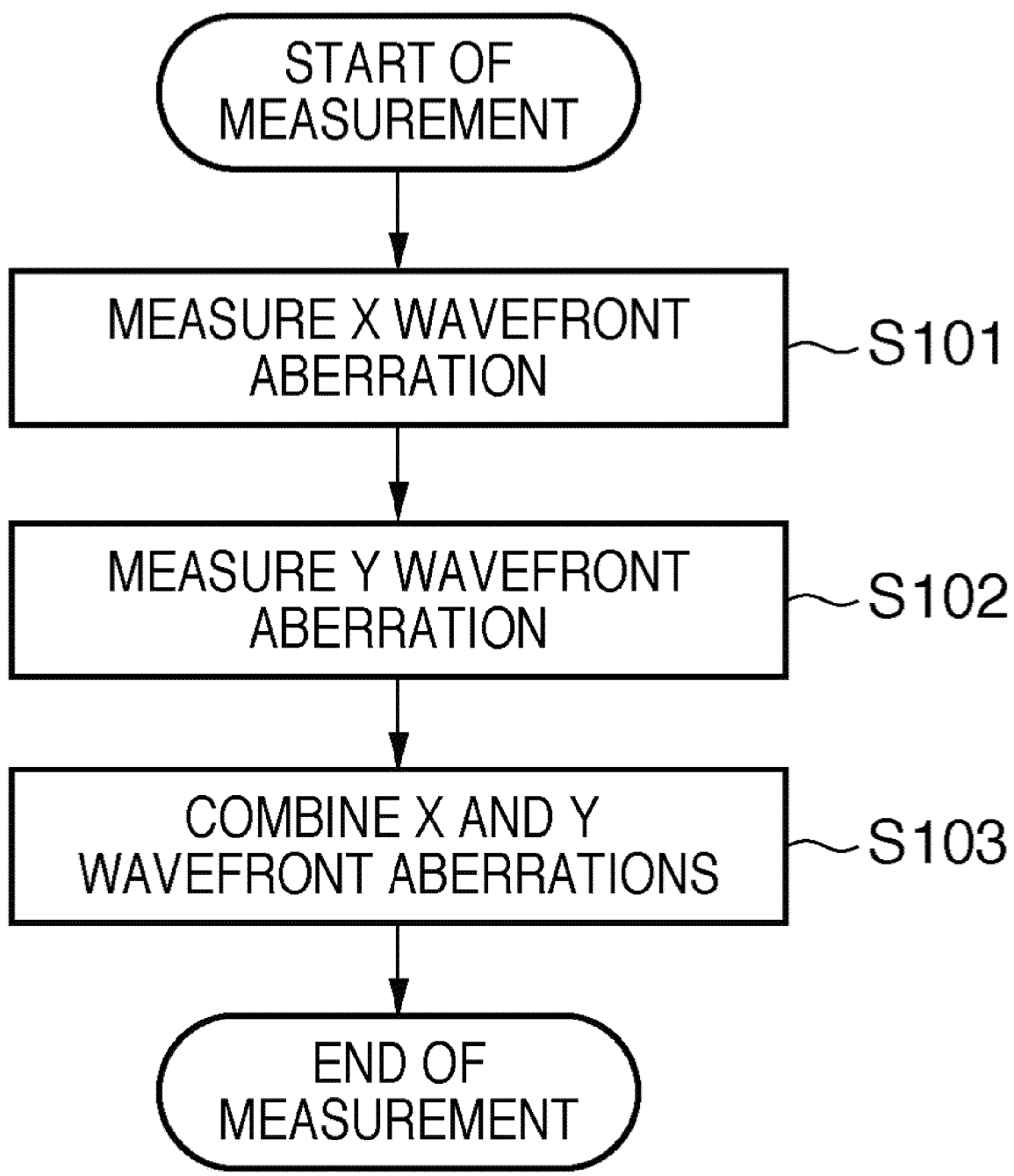
FIG. 12 is a flowchart showing a wavefront aberration measurement operation in the second embodiment.

FIG. 12 is a flowchart showing a wavefronta berration measurement operation in this embodiment. The flowchart shown in FIG. 12 includes step S101 to measure the X wavefront aberration, step S102 to measure the Y wavefront aberration, and step S103 to combine the X and Y wavefront aberrations. The operation of each of the above-mentioned steps will be described below. In step S101 to measure the X wavefront aberration, an image sensing device 53 senses X interference fringes, and a calculation unit 55a calculates the X wavefront aberration based on the sensed X interference fringe data. Step S101 is roughly the same as in the operation sequence shown in FIG. 4 described in the first embodiment, and will be described below with reference to the flowchart shown in FIG. 4. However, for the sake of distinction from the first embodiment, steps S001 to S005 in the first embodiment are replaced with steps S001X to S005X in the following description.

In step S001X, a mask stage controller 24 and stage controller 43 align an illumination optical system 14, the first mask 60', and the second mask 70' in the following way first. The mask stage controller 24 adjusts the positions of the illumination optical system 14 and first mask 60' so that a light beam emitted by a light source unit 12 strikes only the mark 61' in the first mask 60' via a σ stop in the illumination optical system 14 after being guided to the illumination optical system 14. At this time, because the slit 61'a has a width which satisfies inequality (1), the light emerging from the slit 61'a becomes diffracted light with an in-phase spherical wavefront in the X direction and irradiates the entire optical pupil plane of the projection optical system 31. On the other hand, the light beam having passed through the window 61'b becomes that which contains the aberration information of the illumination optical system 14.

The stage controller 43 adjusts the position of a wafer stage 42 so that the light emerging from the mark 61' in the first mask 60' forms an image on the mark 71' in the second mask 70' via the projection optical system 31. With this operation, the slit 61'a in the first mask 60' is imaged on the window 71'b in the second mask 70', and the window 61'b in the first mask 60' is imaged on the slit 71'a in the second mask 70'. A light beam diffracted by the slit 71'a has an in-phase spherical wavefront in the X direction. On the other hand, a light beam transmitted through the window 71'b contains the aberration information of the projection optical system 31 because it is transmitted through the projection optical system 31 after being shaped into an in-phase wavefront in the X direction by the slit 61'a. X interference fringes generated by the abovementioned alignment are sensed by the image sensing device 53, and their phase information is calculated by the calculation unit 55a of a measurement apparatus controller 55. The calculated phase information is stored in a memory unit 55c as X wavefront aberration data containing the aberration information of the projection optical system in the X direction.

The operations in steps S002X to S005X are roughly the same as in steps S002 to S005 in the first embodiment, and a description thereof will not be given. In step S101 to measure the X wavefront aberration described above, the X wavefront aberration is measured at an optimum measurement position. In step S102 to measure the Y wavefront aberration, Y interference fringes are sensed and the Y wavefront aberration is calculated based on the sensed Y interference fringe data. Like step S101, step S102 is roughly the same as in the operation sequence shown in FIG. 4 described in the first embodiment, and will be described below with reference to the flowchart shown in FIG. 4. However, for the sake of distinction from the first embodiment, steps S001 to S005 in the first embodiment are replaced with steps S001Y to S005Y in the following description. In step S001Y, the mask stage controller 24 and stage controller 43 align the illumination optical system 14, the first mask 60', and the second mask 70' in the following way first. The mask stage controller 24 adjusts the positions of the illumination optical system 14 and first mask 60' so that a light beam emitted by the light source unit 12 strikes only the mark 62' in the first mask 60' via the σ stop in the illumination optical system 14 after being guided to the illumination optical system 14. At this time, because the slit 62'a has a width which satisfies inequality (1), the light emerging from the slit 61a 62'a becomes diffracted light with an in-phase spherical wavefront in the Y direction and irradiates the entire optical pupil plane of the projection optical system 31. On the other hand, the light beam having passed through the window 62'b becomes that which contains the aberration information of the illumination optical system 14.

The stage controller 43 adjusts the position of the wafer stage 42 so that the light emerging from the mark 62' in the first mask 60' forms an image on the mark 72' in the second mask 70' via the projection optical system 31. With this operation, the slit 62'a in the first mask 60' is imaged on the window 72'b in the second mask 70', and the window 62'b in the first mask 60' is imaged on the slit 72'a in the second mask 70'. A light beam diffracted by the slit 72'a has an in-phase spherical wavefront in the Y direction. On the other hand, a light beam transmitted through the window 72'b contains the aberration information of the projection optical system 31 because it is transmitted through the projection optical system 31 after being shaped into an in-phase wavefront in the Y direction by the slit 62'a. Y interference fringes generated by the abovementioned alignment are sensed by the image sensing device 53, and their phase information is calculated by the calculation unit 55a of the measurement apparatus controller 55. The calculated phase information is stored in the memory unit 55c as Y wavefront aberration data containing the aberration information of the projection optical system in the Y direction. The operations in steps S002Y to S005Y are roughly the same as in steps S002 to S005 in the first embodiment, and a description thereof will not be given. In step S102 to measure the Y wavefront aberration described above, the Y wavefront aberration is measured at an optimum measurement position. In step S103 to combine the X and Y wavefront aberrations, the calculation unit 55a combines the X wavefront aberration measured in step S101 and the Y wavefront aberration measured in step S102 to calculate a wavefront aberration which bears the aberration information of the projection optical system in the two-dimensional direction.

An operation in the second embodiment has been described above. The use of the wavefront aberration measurement apparatus in this embodiment makes it possible to prevent erroneous wavefront aberration measurement. In addition, if the measurement position is inappropriate, measurement is performed after the measurement position is automatically adjusted into an optimum position. This makes it possible to measure the wavefront aberration with higher stability and higher accuracy than in the prior arts.

Although two embodiments of the present invention have been described above, the present invention is not limited to these embodiments, and various modifications and changes can be made within the spirit and scope of the present invention. For example, although embodiments of a measurement apparatus mounted on an exposure apparatus have been described above, a measurement apparatus need not always be mounted on an exposure apparatus. The measurement apparatus used may be an apparatus, for exclusive use in wavefront aberration measurement, which has functions equivalent to those of the mask stage controller 24, stage controller 43, and projection system controller 32. Moreover, the steps in the flowcharts shown in FIGS. 4 and 12 need not be executed in the foregoing orders. For example, when "very poor" is not expected to be determined for the wavefront state in consideration of the apparatus environment, step S005 need not always be included in the operation sequence. Also, although an example in which the operation sequence shown in FIG. 4 is executed (steps S001X to S005X or S001Y to S005Y) in each of steps S101 and S102 has been described in the second embodiment, the operation order of steps S001X to S005Y need only be aribitrarily optimized in accordance with the environment of the measurement apparatus. Although measurement marks in the x and y directions are adopted in the LDI scheme in the second embodiment, window/slit members in two arbitrary directions (e.g., the 45° and 135° directions) other than the x and y directions may be adopted. Lastly, although measurement apparatus of the PDI scheme and the LDI scheme are used in the embodiments, the same discussion holds true for optical performance measurement apparatus of all schemes, which measure the optical performances of optical systems to be measured using interference fringe, such as the shearing and Fizeau interferometric schemes.

A method of manufacturing a device using the abovementioned exposure apparatus will be described next. The device is manufactured by a step of exposing a substrate using the above-mentioned exposure apparatus, a step of developing the exposed substrate, and subsequent known steps of processing the exposed substrate. The device can be, for example, a semiconductor integrated circuit device or a liquid crystal display device. The substrate can be, for example, a wafer or a glass plate. The known steps include, for example, oxidation, film formation, vapor deposition, doping, planarization, dicing, bonding, and packaging steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-137723, filed Jun. 8, 2009, which is hereby incorporated by reference herein in its entirety.

What is claimed is:

1. A measurement apparatus for measuring a wavefront aberration of an optical system to be measured, the apparatus comprising:
   a calculation unit configured to calculate the wavefront aberration based on an interference fringe generated by light from the optical system to be measured, and generate wavefront aberration data in which a wavefront aberration amount is mapped at each of a plurality of two dimensionally arrayed evaluation points based on the calculated wavefront aberration; and
   a determination unit configured to calculate an evaluation value indicating a wavefront state based on the wavefront aberration data generated by said calculation unit, and determine the calculated wavefront aberration as the wavefront aberration of the optical system if the evaluation value falls within an allowable range,
   wherein the evaluation value indicates the total number of evaluation points whose wavefront aberration amounts have a difference that exceeds a threshold from adjacent evaluation points among evaluation points in the wavefront aberration data generated by said calculation unit.

2. The apparatus according to claim 1, wherein said determination unit:
   classifies, the wavefront aberration calculated by said calculation unit into one of a first rank, a second rank inferior to the first rank, and a third rank inferior to the second rank, based on the evaluation value,
   determines the calculated wavefront aberration as the wavefront aberration of the optical system if said determination unit classifies the calculated wavefront aberration into the first rank,
   determines to change a position of a pattern member which generates an interference fringe and measure the wavefront aberration of the optical system again based on components of specific orders of the calculated wavefront aberration expanded into polynomials if said determination unit classifies the calculated wavefront aberration into the second rank, and
   determines to calculate visibility values of interference fringes based on a plurality of interference fringes sensed by changing the position of the pattern member, change the pattern member to a position where a maximum visibility value of the calculated visibility values is obtained, and measure the wavefront aberration of the optical system again if said determination unit classifies the calculated wavefront aberration into the third rank.

3. The apparatus according to claim 2, wherein the components of specific orders include components of a second term to a four term of Zernike polynomials into which the calculated wavefront aberration is expanded.

4. The apparatus according to claim 2, wherein the visibility value V is given by:

$V=(Imax-Imin)/(Imax+Imin)$, where Imax is a light intensity of the interference fringe in a light portion, and Imin is a light intensity of the interference fringe in a dark portion.

5. An exposure apparatus for projecting a pattern of a reticle onto a substrate via a projection optical system to expose the substrate, the apparatus comprising:
   a measurement apparatus configured to measure a wavefront aberration of the projection optical system, and
   said measurement apparatus comprising
   a calculation unit configured to calculate the wavefront aberration based on an interference fringe generated by light from the projection optical system and generate wavefront aberration data in which a wavefront aberration amount is mapped at each of a plurality of two dimensionally arrayed evaluation points based on the calculated wavefront aberration, and
   a determination unit configured to calculate an evaluation value indicating a wavefront state based on the wavefront aberration data generated by said calculation unit, and determine the calculated wavefront aberration as the wavefront aberration of the projection optical system if the evaluation value falls within an allowable range,
   wherein the evaluation value indicates the total number of evaluation points whose wavefront aberration amounts have a difference that exceeds a threshold from adjacent evaluation points among evaluation points in the wavefront aberration data generated by said calculation unit.

6. A method of manufacturing a device, the method comprising the steps of:
   exposing a substrate to light using an exposure apparatus;
   developing the exposed substrate; and
   processing the developed substrate to manufacture the device,
   wherein the exposure apparatus comprises a measurement apparatus configured to measure a wavefront aberration of a projection optical system, and project pattern of a reticle onto a substrate via the projection optical system to expose the substrate, and
   wherein the measurement apparatus comprises:
   a calculation unit configured to calculate the wavefront aberration based on an interference fringe generated by light from the projection optical system, and generate wavefront aberration data in which a wavefront aberration amount is mapped at each of a plurality of two dimensionally arrayed evaluation points based on the calculated wavefront aberration, and
   a determination unit configured to calculate an evaluation value indicating a wavefront state based on the wavefront aberration data generated by the calculation unit, and determine the calculated wavefront aberration as the wavefront aberration of the projection optical system if the evaluation value falls within an allowable range,
   wherein the evaluation value indicates the total number of evaluation points whose wavefront aberration amounts have a difference that exceeds a threshold from adjacent evaluation points among evaluation points in the wavefront aberration data generated by said calculation unit.

* * * * *